(12) United States Patent
Byczkowski et al.

(10) Patent No.: US 11,881,362 B2
(45) Date of Patent: Jan. 23, 2024

(54) WAREWASH MACHINE OR OTHER FOOD EQUIPMENT MACHINE WITH CONTACTOR MONITORING SYSTEM

(71) Applicant: ILLINOIS TOOL WORKS INC., Glenview, IL (US)

(72) Inventors: Leszek P. Byczkowski, Fairborn, OH (US); Alexander R. Anim-Mensah, Dayton, OH (US)

(73) Assignee: ILLINOIS TOOL WORKS INC., Glenview, IL (US)

( * ) Notice: Subject to any disclaimer, the term of this patent is extended or adjusted under 35 U.S.C. 154(b) by 193 days.

(21) Appl. No.: 17/341,708

(22) Filed: Jun. 8, 2021

(65) Prior Publication Data

US 2021/0398753 A1 Dec. 23, 2021

Related U.S. Application Data

(60) Provisional application No. 63/042,076, filed on Jun. 22, 2020.

(51) Int. Cl.
*A47L 15/00* (2006.01)
*A47L 15/42* (2006.01)
*H01H 1/00* (2006.01)
*A47L 15/46* (2006.01)

(52) U.S. Cl.
CPC ....... *H01H 1/0015* (2013.01); *A47L 15/0049* (2013.01); *A47L 15/4285* (2013.01); *A47L 15/4287* (2013.01); *A47L 15/46* (2013.01); *A47L 2401/12* (2013.01); *A47L 2401/30* (2013.01); *A47L 2501/05* (2013.01); *A47L 2501/06* (2013.01); *A47L 2501/26* (2013.01); *A47L 2501/32* (2013.01)

(58) Field of Classification Search
None
See application file for complete search history.

(56) References Cited

U.S. PATENT DOCUMENTS

| 7,705,601 B2 * | 4/2010 | Zhou ............... H01H 1/0015 |
| | | 324/415 |
| 2012/0014019 A1 | 1/2012 | Duscher |
| 2020/0060505 A1 * | 2/2020 | Jarjour ............... A47L 15/0081 |

FOREIGN PATENT DOCUMENTS

| CA | 2192265 A1 | 6/1997 |
| CN | 109490762 A | 3/2019 |
| DE | 102010028533 A1 | 11/2011 |

(Continued)

*Primary Examiner* — Rita P Adhlakha
(74) *Attorney, Agent, or Firm* — THOMPSON HINE LLP

(57) ABSTRACT

A food equipment device, such as a warewasher, includes a powered component, the powered component being one of a heating element or a pump or a fan, and a power line path for delivering power to the powered component. A contactor is provided for controlling power delivery to the powered component, the contactor including main power contacts connected in the power line path and auxiliary contacts that operate the same as, or opposite to, the main power contacts. A monitoring system is operatively connected to the auxiliary contacts to monitor an open or closed state of the auxiliary contacts and includes a voltage source operatively connected to one of the auxiliary contacts and an electrical sensor for detecting one of (i) a voltage condition of the other auxiliary contact or (ii) a current flow condition between the auxiliary contacts.

16 Claims, 12 Drawing Sheets

(56) References Cited

FOREIGN PATENT DOCUMENTS

| | | |
|---|---|---|
| DE | 102010031235 A1 | 1/2012 |
| DE | 102018217135 A1 | 10/2019 |
| EP | 2491847 A2 | 8/2012 |

* cited by examiner

|  | CONTROLLER COMMAND ON MAIN POWER CONTACTOR | |
|---|---|---|
|  | CLOSE<br>NORMAL MODE (A)<br>CONTROLLER COMMANDS AN INITIALLY OPEN CONTACTOR TO CLOSE, CONTACTOR CLOSES AND THE CONTACTOR'S AUXILIARY/SIDE SWITCH OPENS.<br>• BOTH CONTACTOR AND AUXILIARY SWITCH ARE OPERATING AS EXPECTED | ABNORMAL MODE (B)<br>CONTROLLER COMMANDS AN INITIALLY OPEN CONTACTOR TO CLOSE, BUT THE CONTACTOR DOES NOT EXECUTE THE COMMAND AND STAYS OPEN, AND THE CONTACTOR'S AUXILIARY/SIDE SWITCH STAYS CLOSED.<br>• CONTACTOR IS DISENGAGED AND STUCK IN A OPEN MODE.<br>• PROCESSES RELYING ON CONTACTOR WILL NOT BE OPERATIONAL<br>• SERVICE CALL NEEDED TO EITHER CHANGE THE CONTACTOR OR RESOLVE ASSOCIATED THE ISSUES |
| OPEN | ABNORMAL MODE (D)<br>CONTROLLER COMMANDS AN INITIALLY CLOSED CONTACTOR TO OPEN, BUT THE CONTACTOR DOES NOT EXECUTE THE COMMAND AND STAYS CLOSED, AND CONTACTOR'S AUXILIARY/SIDE SWITCH REMAINS OPEN.<br>• CONTACTOR IS ENGAGED AND STUCK IN THE ENERGIZED POSITION.<br>• MACHINE SELF-INTERVENTION REQUIRED WHEN MACHINE IS IN OPERATION<br>• SERVICE CALL NEEDED EITHER TO CHANGE THE CONTACTOR OR RESOLVE ASSOCIATED THE ISSUES | NORMAL MODE (C)<br>CONTROLLER COMMANDS AN INITIALLY CLOSE CONTACTOR TO OPEN, CONTACTOR OPENS WHICH THE CONTACTOR'S AUXILIARY/SIDE SWITCH CLOSES<br>• BOTH CONTACTOR AND AUXILIARY SWITCH ARE OPERATING AS EXPECTED |
|  | OPEN | CLOSED |

*CONTACTOR'S AUXILIARY/SIDE SWITCH RESPONSE*

Fig. 4A

| AREAS IN FIG. 4A | CONTACTOR'S INITIAL STATE (MAIN POWER CONTACTS) | CONTROLLER COMMAND | CONTACTOR REACTION (MAIN POWER CONTACTS) | CONTACTOR AUXILIARY/SIDE SWITCH CONTACTS REACTION |
|---|---|---|---|---|
| A | OPEN | CLOSED | CLOSED | OPEN |
| C | CLOSED | OPEN | OPEN | CLOSED |
| B | OPEN | CLOSED | OPEN | CLOSED |
| D | CLOSED | OPEN | CLOSED | OPEN |

Fig. 4B

WAREWASH MACHINE OR OTHER FOOD EQUIPMENT MACHINE WITH CONTACTOR MONITORING SYSTEM

TECHNICAL FIELD

This application relates general to food equipment machines, and more particularly to a warewash machine, with a system for monitoring a control contactor of the machine.

BACKGROUND

Warewash machines, as well as other food equipment devices, such as cooking devices (e.g., convection ovens, steam ovens, electrical cooktops), food thawing devices and food holding devices, are frequently used by commercial enterprises, such as restaurants and cafeterias. The machines often include one or more contactors for controlling a machine component, such as a heating element or a pump. Contactor failure is undesirable as it adversely impacts machine operation and use. Predictive maintenance (PM) is preferable to the common, historical break-and-fix maintenance model, because of cost and down time.

It would be desirable to provide a warewash machine, or other food equipment machine, with a contactor monitoring system.

SUMMARY

A system for identifying or predicting failures with equipment that uses contactors to control components such as heaters, pumps, fans and compressors for appropriate intervention or action by monitoring the behavior of both the contactor and an auxiliary or side switch contactor and their responses to commands from a controller.

In any contactor with an auxiliary/side switch position, a predetermined voltage is applied to one leg of the auxiliary or side switch and monitoring of the magnitude and behavior of the feedback voltage at the other leg, within some predetermined time intervals, is used to determine the contactor's operational or failure status for the necessary actions and/or interventions.

In one aspect, a warewash machine includes a housing at least in part defining a treatment chamber having an access opening; at least one nozzle for emitting liquid into the treatment chamber; a tank including a heating element for heating liquid in the tank, and a line running from the tank to the at least one nozzle; a power line path for delivering power to the heating element; a contactor for controlling power delivery to the heating element, the contactor including main power contacts connected in the power line path and auxiliary contacts that operate the same as, or opposite to, the main power contacts; and a monitoring system operatively connected to the auxiliary contacts to monitor an open or closed state of the auxiliary contacts, wherein the monitoring system is configured to identify abnormal contactor operation based upon the open or closed state of the auxiliary contacts.

In another aspect, a food equipment device includes: a powered component, the powered component being one of a heating element or a pump or a fan; a power line path for delivering power to the powered component; a contactor for controlling power delivery to the powered component, the contactor including main power contacts connected in the power line path and auxiliary contacts that operate the same as, or opposite to, the main power contacts; a monitoring system operatively connected to the auxiliary contacts to monitor an open or closed state of the auxiliary contacts; wherein the auxiliary contacts include a first auxiliary contact and a second auxiliary contact; wherein the monitoring system includes a voltage source operatively connected to the first auxiliary contact and an electrical sensor for detecting one of (i) a voltage condition of the second auxiliary contact or (ii) a current flow condition between the first auxiliary contact to the second auxiliary contact.

In a further aspect, a method is provided for operating a food equipment device that includes a contactor includes main power contacts and first and second auxiliary contacts, wherein the main contacts are connected in a power line path to a powered component of the device. The method involves the steps of: applying a voltage to the first auxiliary contact; detecting at least one of (i) a voltage condition at the second auxiliary contact or a current flow condition between the first auxiliary contact and the second auxiliary contact; and identifying abnormal contactor operation based upon at least (i) the voltage condition or the current condition and (ii) a command state of the main power contacts.

The details of one or more embodiments are set forth in the accompanying drawings and the description below. Other features, objects, and advantages will be apparent from the description and drawings, and from the claims.

BRIEF DESCRIPTION OF THE DRAWINGS

FIG. 4A is a chart showing contactor modes/states;
FIG. 4B is a table showing contactor commands and modes/states.

DETAILED DESCRIPTION

Figure 1:
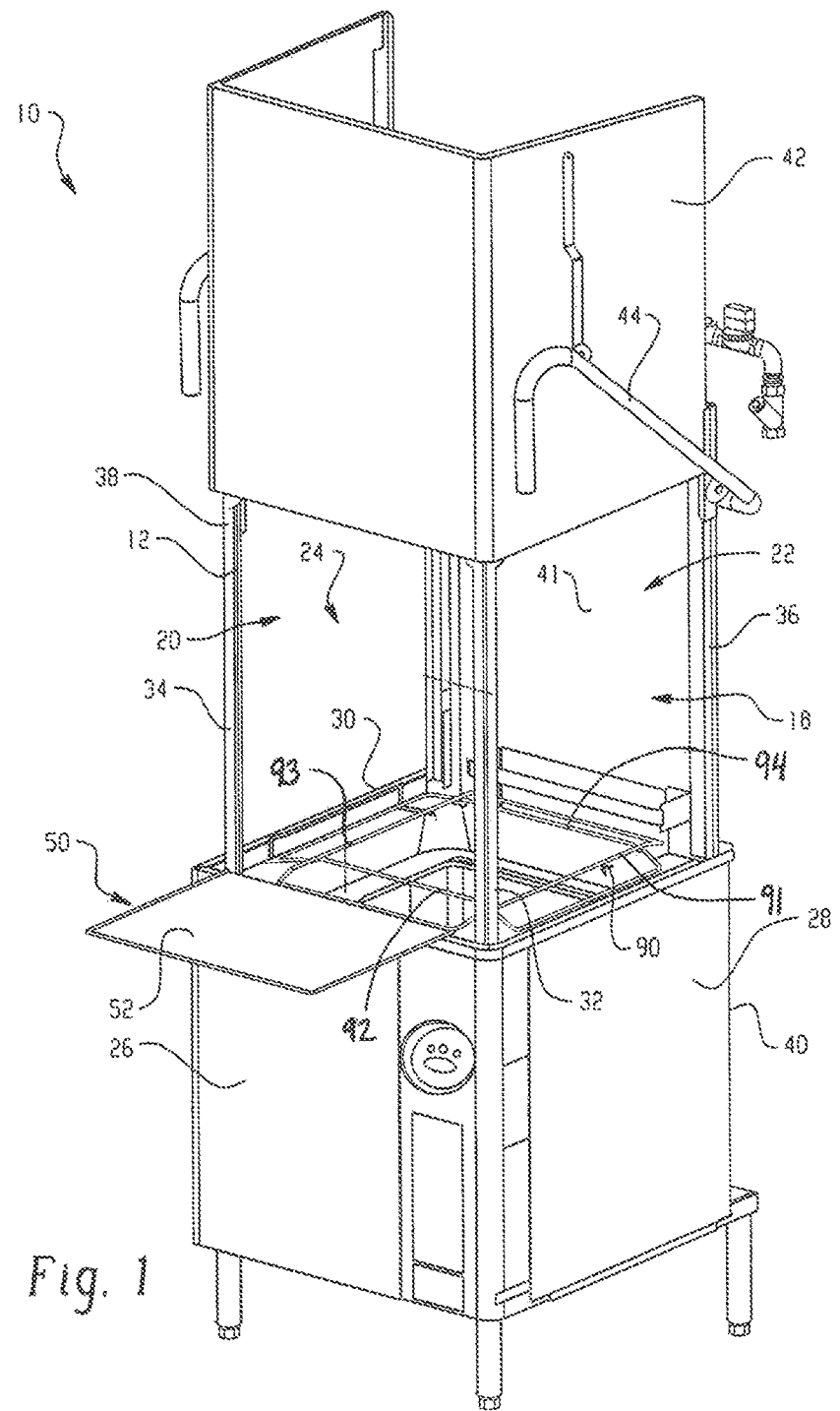
FIG. 1 is a perspective view of a hood-type warewash machine.
Figure 3:
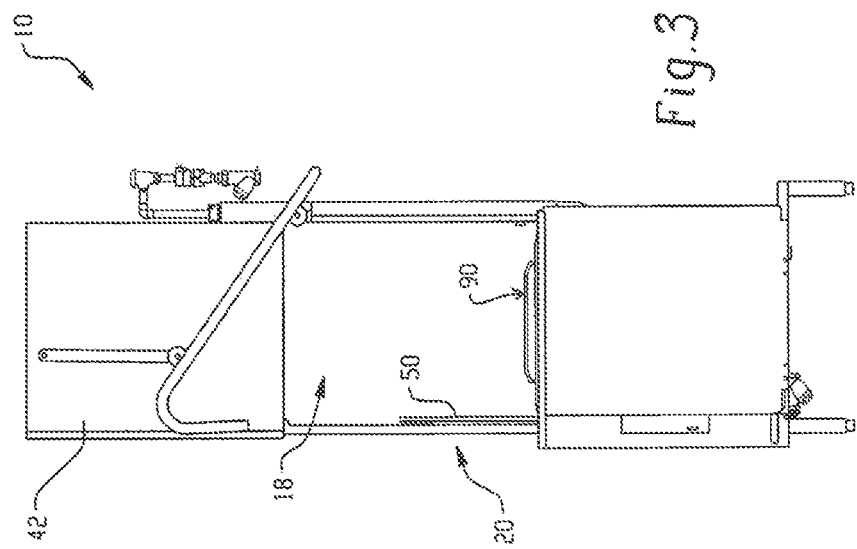
FIG. 3 is a side view of the machine with hood raised.
Figure 2:
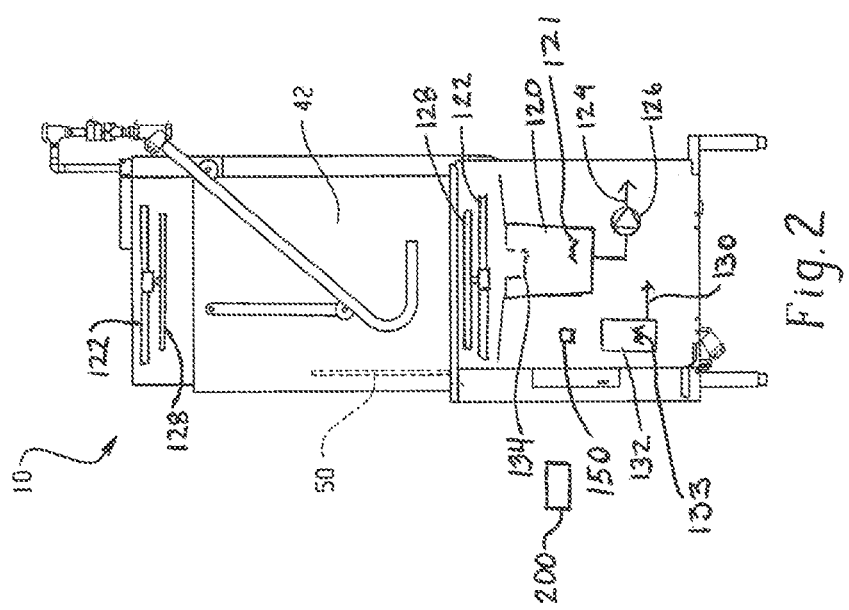
FIG. 2 is a side view of the machine with hood lowered.

Referring to FIGS. 1-3, a warewash machine 10 includes a housing formed by a frame 12 and various panels or similar structure. A treatment chamber 18 is located internally of the housing. For the placement and removal of wares into and out of the treatment chamber 18, a set of access openings 20, 22, 24 are provided. The access openings 20, 22, 24 are disposed at the front 26 and right and left sides 28, 30, respectively, of the warewash machine 10 and, in the illustrated embodiment, are located between frame members 32, 34, 36, 38. At a rear side 40 of the warewash machine 10, a rear housing panel 41 is attached to the warewash machine, e.g., to inhibit access to the treatment chamber 18 from the rear side 40. To control access to the treatment chamber 18 from the front 26 and sides 28, 30, a three-sided door 42 is provided that can slide or pivot between closed and open positions using arm 44.

Extending outwardly at the front 26 of the warewash machine 10 is a table 50. Table 50 is pivotally mounted to the warewash machine 10 and is shown in a load/unload position (FIG. 1) with a broad, planar upper surface 52 extending outwardly from the front 26 of the warewash machine in a rack supporting orientation in which a rack will be supported vertically above the floor. The table 50 can be pivoted from its load/unload position (e.g., for supporting a rack of wares) to a vertical storage position (e.g., for cleaning the table during a routine ware washing operation), as per FIGS. 2 and 3 that show the hood down and hood up positions of the machine.

A rack track 90 is also shown in FIG. 1. The illustrated rack track 90 is of a metal bar or wire form configuration, with upper bar sections 91, 92, 93 and 94 defining a support surface for a rack containing wares to be cleaned (e.g., dishes, glasses, pots and/or pans etc.).

As shown schematically in FIG. 2, the warewash machine includes a wash system including a wash tank 120 with heating elements 121, upper and/or lower wash arms 122 with a plurality of spray nozzles oriented to spray onto wares in the treatment chamber. A wash line 124 runs from the wash tank to the wash arm(s), and a wash pump 126 is located along the wash line. Upper and/or lower rinse arms 128 are also provided, to which rinse liquid may be fed via a rinse line 130 running from a booster heater 132 that includes a heating element 133 (e.g., under mains pressure or via a rinse pump (not shown)).

During a typical ware cleaning cycle, wash liquid is recirculated by the wash pump 126 and delivered to the wash arms 122 for spraying for a set time period, and then the wash pump 126 is turned off and rinse liquid is delivered to the rinse arms 128 for spraying. The wash tank may typically have an associated filter screen and/or basket 134 to filter out larger food scraps that fall from the wares during ware cleaning. The basket 134 may be removable for cleaning and to provide access to the internals of the wash tank 120 for cleaning and/or maintenance.

Power delivery to one or more of the various components of the machine may be regulated by a contactor. For example, contactor 150 may be operated to control whether power is delivered to the wash tank heating element 121, (e.g., a controller 200 is operatively connected to a control input of the contactor to control the open/closed state of the main power contacts of the contactor 150, which are connected in the power line path to the heating element 121). When the main power contacts are open, power is not delivered to the element 121, and when the main power contacts are closed, power is delivered to the element 121.

Contactors commonly also include a set of auxiliary contacts that operate opposite to the main power contacts. Specifically, the auxiliary contacts are mechanically linked with the main power contacts to force the auxiliary contacts open when the main power contacts are closed, and to force the auxiliary contacts closed when the main power contacts are opened. Using this contactor feature, a contactor monitoring system can be implemented in the warewash machine, or other food machine, as will be described in further detail below.

FIG. 4A shows the various operational modes of a contactor's main contacts and its auxiliary/side switch contacts in response to commands from the controller to determine a contactor's operational status to prompt desired interventions, if any. Generally, the contactor main contacts and its auxiliary switch contacts operate in opposite open and closed positions (i.e., when the contactor main contacts are open its auxiliary switch contacts are closed and vice-versa).

The various combinations of normal and abnormal are shown in the table of FIG. 4A and individual situations are illustrated by FIGS. 5A-5D. In any position of the contactor main power contacts 110 relative to its auxiliary/side switch contacts 112, a predetermined voltage is applied (via voltage source 114) across one leg or contact of the contactor's auxiliary or side switch to ground and that other auxiliary contact is monitored for feedback (e.g., via a voltage detector 116 and controller 200) to make the necessary determinations. Various configurations of contactor's initial states, controller commands, contactor main contacts reactions and contactor auxiliary/side switch contacts reactions for identifying contactor normal and abnormal mode are shown in the table of FIG. 4B.

Normal Contactor Modes

Figure 5A:
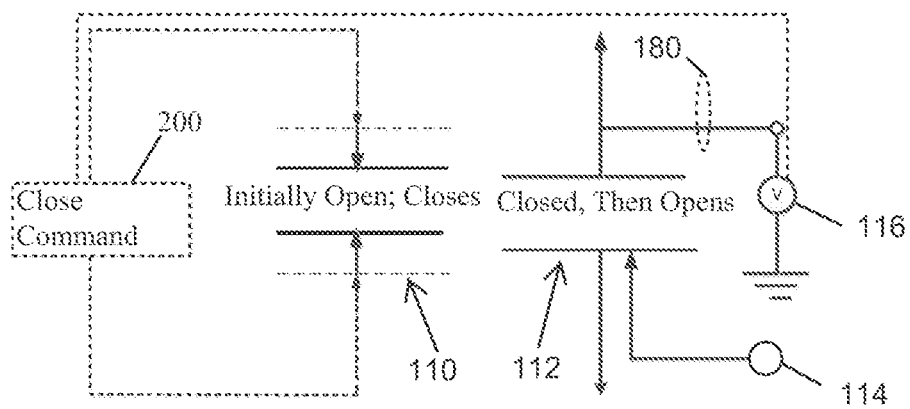
FIGS. 5A-5D schematically show contactor operation in various states.
Figure 5B:
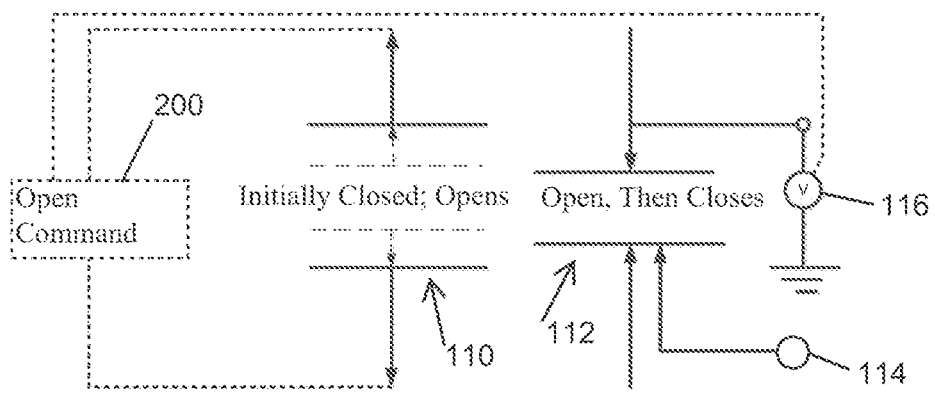

FIG. 5A (Area A, FIG. 4A) and FIG. 5B (Area C, FIG. 4A) illustrate the main power contacts of the contactor and its auxiliary/side switch contacts in normal operation. This area is where the contactor is operating as expected responding to the commands from the controller.

In FIG. 5A, the contactor main contacts 110 are initially open, obey the controller's close command, which energizes a connected device or equipment, while the contactor's auxiliary switch contacts 112 are initially closed, and then open. A predetermined voltage (say 20V) is applied across one of the auxiliary contacts to ground, and the output voltage V at the other auxiliary contact is monitored as feedback to make determinations of the state of the contactor. With the contactor's auxiliary or side switch contacts open, the monitored voltage is expected to read almost close to zero (0) or no voltage as long as the auxiliary or side switch contacts are open. This combination of controller command—close, main contacts response-closed as well as the auxiliary or side contacts open as indicated by voltage output of 0 (e.g., below some threshold voltage near zero) indicates the contactor is operating as expected or in a normal mode, hence, no intervention or action is required.

Considering FIG. 5B, the contactor main contacts 110 are initially closed, obey the controller's open command, which de-energizes a connected device or equipment, while the contactor's auxiliary switch contacts 112 are initially open, then close. Here, the detected voltage of the auxiliary switch contact is expected to be the same as the applied voltage (e.g., 20V or above some threshold at or near 20V). This combination of controller command—open, main contacts response—open, as well as the auxiliary or side contacts closed, resulting in detected auxiliary voltage output similar to input indicates the contactor is operating as expected or in a normal mode, hence, no intervention or action is required.

Abnormal Contactor Modes

Figure 5C:
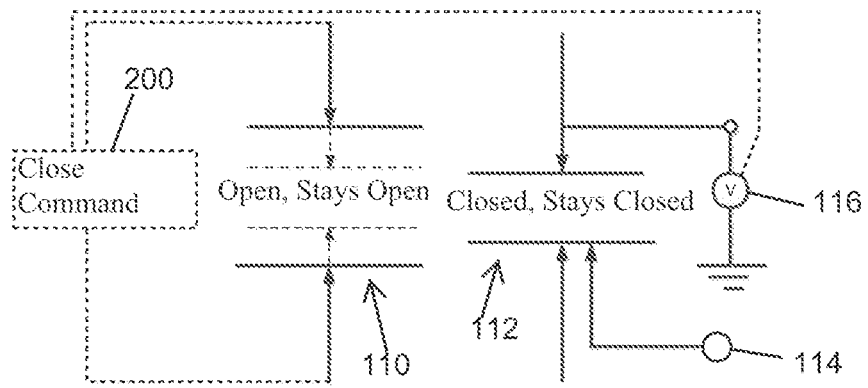

Abnormal Mode (B) is reflected in FIG. 5C. The contactor main contacts 110 are initially open, do not obey the controller's close command and stay open, preventing de-energizing of a connected device or equipment, while the contactor's auxiliary switch contacts 112 are initially closed and stay closed. With the auxiliary switch contacts in closed position, the detected voltage is the same as the applied (e.g., 20V), indicating abnormal operation. This combination of controller command—close, main contacts response—staying open, as well as the auxiliary or side contacts staying closed, resulting in detected auxiliary voltage output similar to input indicates the contactor is operating abnormally, with the main contacts of the contactor stuck in the open position.

In this condition, the contactor main contacts are stuck in the de-energized mode, which leads to machine malfunctioning since the device connected to the contactor main contacts will not be energized. This condition calls for action or intervention.

Figure 5D:
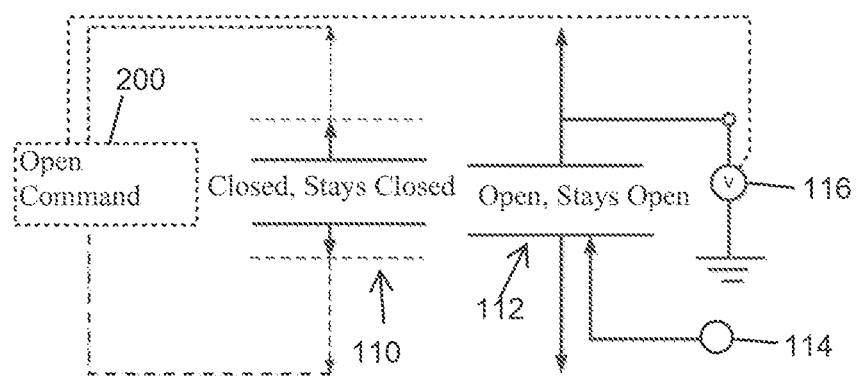

Abnormal Mode (D) is reflected in FIG. 5D. The contactor main contacts 110 are initially closed, do not obey the controller's open command and stay closed to continue energizing a connected device or equipment, while the contactor's auxiliary switch contacts 112 are initially open and stay open, resulting in no detected voltage (close to zero), indicating abnormal operation. This combination of controller command—open, main contacts response—staying closed, as well as the auxiliary or side contacts staying open, resulting in little or no detected voltage, indicates the contactor is operating abnormally, with the main contacts stuck in the closed position, such that a component continues to be powered when it is not desired. This condition calls for machine self-action or intervention until arrival of a service technician to make a repair (replace the contactor).

Exemplary Operation in Connection with a

Washing Machine Wash Tank Heating Element

Figure 6:
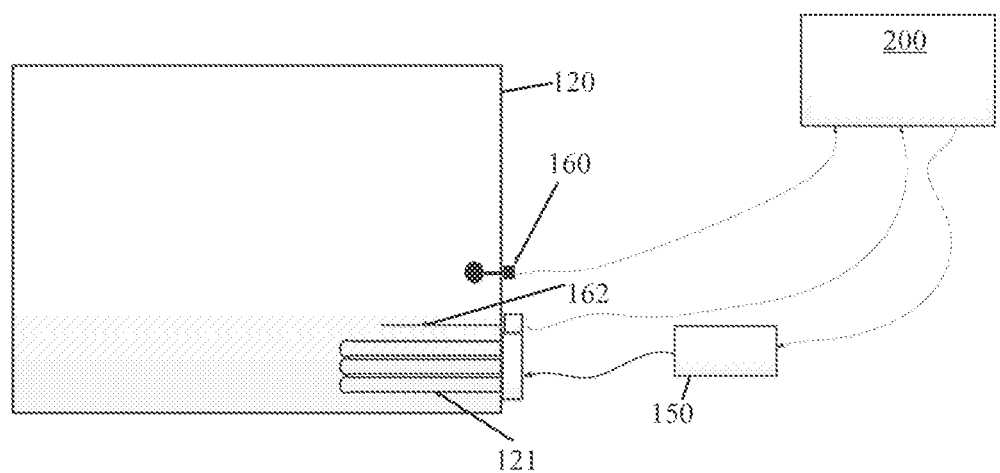
FIG. 6 shows an exemplary warewash tank system.

FIG. 6 shows a wash tank 120 equipped with a level indicator 160, thermocouple 162, and heating element 121 with a contactor/auxiliary switch assembly 150 all connected to a controller 200. The areas of primary concern are Areas B and D of FIG. 4A.

In any mode of machine start-up, steady state and shutdown, the contactor is expected to obey the controller's command. However, per areas B and D, in some cases the contactor fails to execute the controller's command. The controller command to the contactor, the reaction of the contactor main contacts, as well as the contactor's auxiliary switch contacts voltage output profile or condition, is used by the controller 200 to determine the state of the contactor 150 to prompt the necessary action or intervention.

In FIG. 6, the thermocouple 162 sends a signal to the controller 200 to either turn on the heating element to heat wash water to a minimum temp or maintain a minimum temperature (say 150° F. for hot operated machines or 120° F. for a cold operated machine), while wash water level is at least at the minimum water level. The thermocouple sends a turn off signal to the controller 200 when the wash water temp reaches an upper set point. Four scenarios outlined in FIGS. 5A-5D and FIG. 4A could occur, where FIGS. 5A and 5B are considered normal contactor operation and FIGS. 5C and 5D abnormal contactor operation. The controller 200 detects the voltage at the output contact of the auxiliary contacts multiple, repeated times during machine operation, for increased accuracy.

Figure 7A:
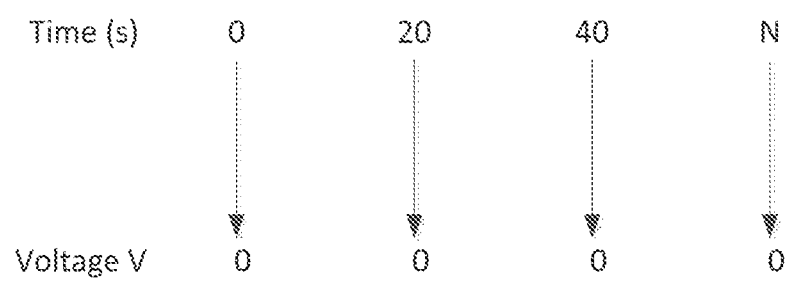
FIGS. 7A-7B show exemplary voltage detection across auxiliary contacts for contactor conditions.

For the condition of FIG. 5A, the detected voltage will repeatedly be zero or near zero, per FIG. 7A. For the condition of FIG. 5B, the detected voltage will repeatedly be the same as or near the applied voltage, per FIG. 7B. No action is needed in either of these conditions, given normal contactor operation.

Figure 7B:
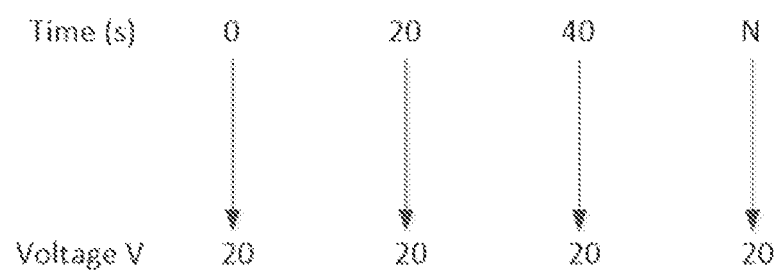

For the condition of FIG. 5C, the detected voltage will repeatedly be the same as or near the applied voltage, per FIG. 7B, indicating abnormal contactor operation. In this state, the machine controller initiates an electronic error message (e.g., to machine HMI or other display or audio device or text or e-mail) indicating a low temperature condition, to prompt the machine operator to check or call service.

For the condition of FIG. 5D, the detected voltage will repeatedly be zero or near zero, per FIG. 7A, indicating abnormal contactor operation. In this condition, the machine controller initiates a shut down mode, which may involve triggering an operator alert, while monitoring the water levels in the wash tank and booster to ensure the tanks are or remain full and if low, the controller turns on the fill the tanks (e.g., opens a fill valve) to maintain sufficient water levels so that the heating element(s) remain submerged. The controller deactivates the tank drain pump, the machine will not operate for wash operations, and an error message prompts for a service call to fix the situation.

Predicting of contactors close to end of life can also be implemented before the contactors become totally/permanently stuck. Given that the contactor could fail either in a total open or deenergized mode as well as in a total closed or energized mode, both scenarios are unwanted. However, before either situation happens, there often preexists contactor intermittent abnormal operation occurrence.

Figure 8A:
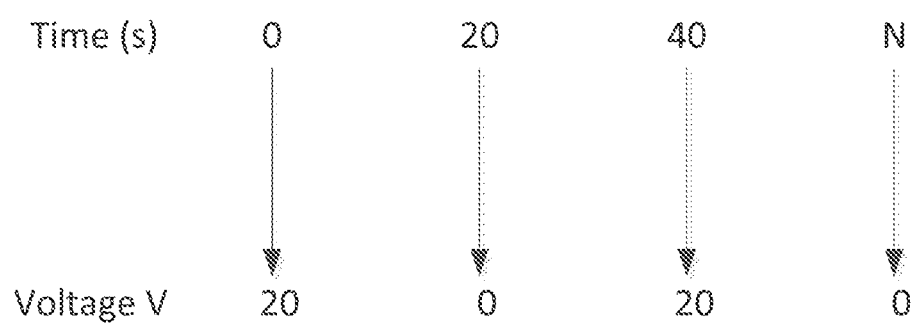
FIGS. 8A-8B show exemplary voltage detection across auxiliary contacts for contactor conditions.
Figure 8B:
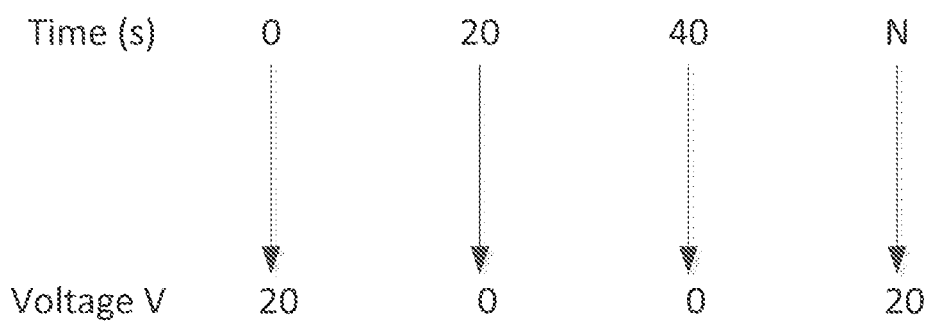

One intermittent situation involves a contactor with main power contacts initially closed, which are supposed to open to de-energize under controller's command, but instead cycle between the open and closed positions, with the corresponding auxiliary contacts also cycling between closed and open positions. FIGS. 8A and 8B show possible detected auxiliary voltage profiles in such situations. Various other combinations of the short and long cycles are possible; however, each starts with initial contactor open mode and corresponding auxiliary contactor closed mode with similar auxiliary output and input of 20 V. The controller's command to open the contactor main contacts is initially executed, followed by non-execution, either in a regular or irregular/random manner, such that the contactor auxiliary switch contacts detected voltage output is used to identify the state of a regular cyclic or irregular/randomized stuck open and closed contactor. This type of improper cycling of the contactor contacts, as indicated by the detected voltage cycling, is used by the controller 200 to predict a contactor nearing the end of its life or approaching a total failed close state. This situation requires intervention, such as that of the condition FIG. 5D described above (e.g., machine shut down etc.).

Figure 9A:
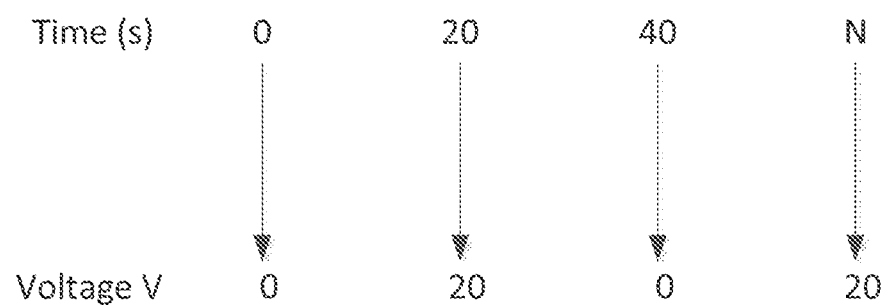
FIGS. 9A-9B show exemplary voltage detection across auxiliary contacts for contactor conditions.
Figure 9B:
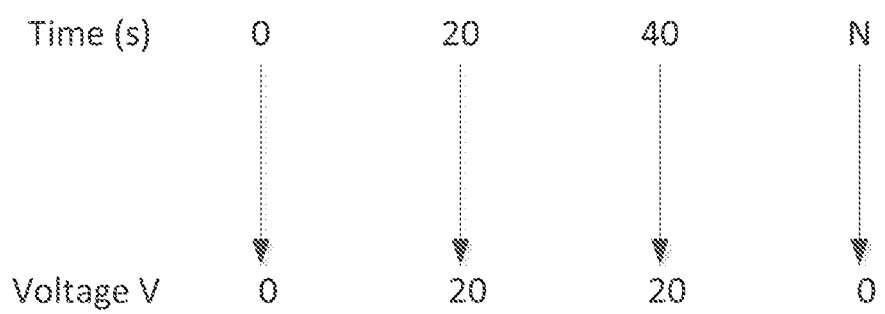

Another intermittent situation involves a contactor with main power contacts initially open that are supposed to close to energize under controller's command, but instead cycle between the closed and open positions with the corresponding auxiliary contacts cycling between open and closed positions. FIGS. 9A and 9B show possible detected voltage profiles in such situations. Various other combinations of the short and long cycles are possible; however, each starts with initial contactor closed mode and corresponding auxiliary contactor open mode with auxiliary voltage output at or near 0V. The controller's command to close the contactor main contacts is initially executed, followed by non-execution, either in a regular or irregular/random manner, such that the contactor auxiliary switch contacts detected voltage output is used by the controller to identify the state of a regular cyclic or irregular/randomized stuck closed and open contactor. This situation requires intervention, similar to that of FIG. 5C described above (e.g., error message will prompt the operator to call for a service technician to change or service the contactor).

Thermocouple readings can also be included in the contactor monitoring system to improve the certainty of the contactor failure identification or prediction.

In all the cases illustrated in FIGS. 5A-5D as well as in FIG. 4A, temperature monitoring could be added as an extra precautional layer to improve on the certainty of the identification of contactor's condition. Collecting the contactor's auxiliary switch contacts output voltage data or profile at some predetermined time intervals, simultaneously with the wash water temperature, can be used to improve on contactor state identification.

Figure 10A:
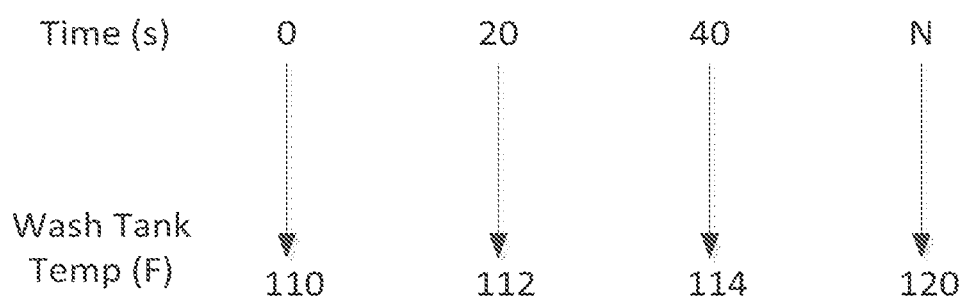
FIGS. 10A-10B show exemplary tank temperature detection for contactor conditions.

For the FIG. 5A normal contactor mode, with an initial wash tank water temperature of 110° F., warming from start-up with the heating element energized will over time see a rise in the temperature as exemplified in FIG. 10A. The actual rate of temperature rise will be dependent on the temperature recording time intervals, volume of water being heated, position of the thermocouple as well as the kW of the heating element. The detected auxiliary voltage will also be as shown in FIG. 7A. No intervention or action is required in this case.

Figure 10B:
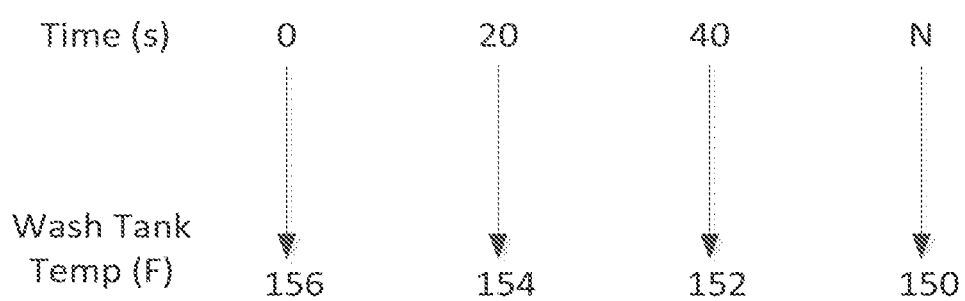

For the FIG. 5B normal contactor mode, with wash water with temperature corresponding to the upper temperature set point say 200° F., the thermocouple sends a signal to the controller to de-energize the heating element or position contactor main contacts in the open mode, resulting in a temperature decrease per FIG. 10B. The actual rate of temperature drop dependent on the temperature recording time intervals, volume of water being heated, position of the thermocouple. The detected auxiliary voltage will also be as shown in FIG. 7B. No intervention or action is required in this case.

Figure 11A:
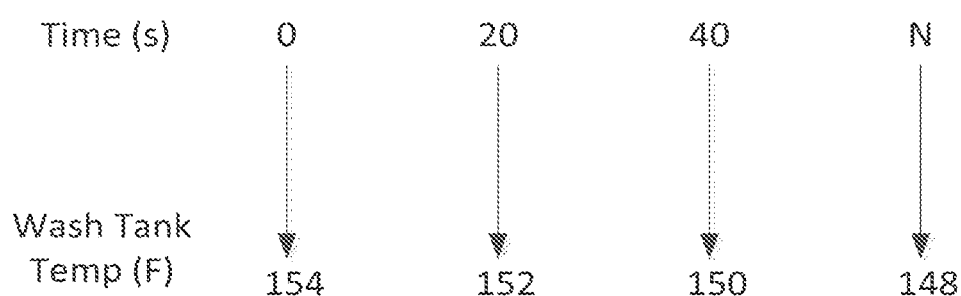
FIGS. 11A-11B show exemplary tank temperature detection for contactor conditions.

For the FIG. 5C contactor mode, as reflected in FIG. 11A, the wash tank water temperature will begin dropping over time, when it is not supposed to do so. In this scenario, the wash water cools down over time past the lower set point of say 150° F. The detected auxiliary contact voltage will also be as shown in FIG. 7B. Thus, the controller sees two indications of the contactor abnormal operation, and the controller triggers error messages for service technician intervention.

Figure 11B:
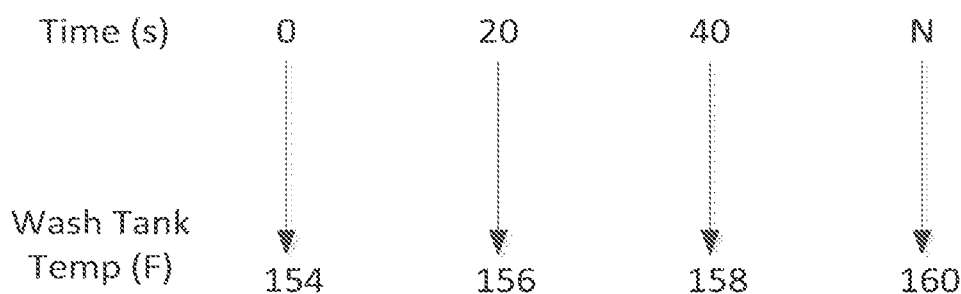

For the FIG. 5D contactor mode, as reflected in FIG. 11B, the wash tank water temperature continues to rise, passing the upper set point (e.g., reaching 156° F. for hot operated machine). The detected auxiliary contact voltage will also be as shown in FIG. 7A. Thus, the controller sees two indications of the contactor abnormal operation, and the controller may initiate the shut-down mode mentioned above.

Various advantageous functions and operations are provided by the contactor monitoring system, as noted below.

Identifying a contactor's normal operation where a contactor with main power contacts initially open executes the controller's close command while contactor's auxiliary contacts open. An input voltage applied to one leg or contact of the auxiliary switch to ground results in detected voltage of 0 as long as the auxiliary switch is open. No intervention or action is required since contactor is operating as expected.

Identifying a contactor's normal operation where a contactor with main power contacts initially closed executes controller's open command while contactor's auxiliary contacts close. An input voltage applied to one leg or contact of the auxiliary switch to ground results in detected output voltage that is about same as the input voltage as long as the auxiliary switch is closed. No interventions or action required since contactor is operating as expected.

Identifying a contactor's abnormal operation where a contactor with main power contacts initially open fails to execute controller's close command while contactor's auxiliary contacts remain closed. An input voltage applied to one leg or contact of the auxiliary switch to ground results in detected output voltage that is about same the input voltage as long as the auxiliary switch is closed. A device connected in-line with the contactor main contacts is not energized, which causes an error message prompting for service required interventions.

Identifying a contactor's abnormal operation where a contactor with main contacts initially closed fails to execute controller's open command while contactor's auxiliary contacts remain open. An input voltage applied to one leg or contact of the auxiliary switch to ground results in detected output voltage of about zero (0) as long as the auxiliary switch is open. A device connected in-line with the contactor main power contacts continues to be energized, which prompts for machine self-intervention including: an error message, ensuring water levels in the wash tank and booster are at acceptable levels (if low, machine turns on the fill to maintain level, machine deactivates and locks out the drain pump) and concurrently prompting for service required intervention.

Predicting contactors nearing end of life or in the process of getting totally stuck open where an initially opened contactor cycles between executing command i.e. closed and not executing command i.e. opened under controller's close command either in a regular or irregular/random manner. Correspondingly, the auxiliary switch cycles between open and close positions. An input voltage applied to one leg of the auxiliary switch to ground outputs cycle between same as input and zero (0) so far as the auxiliary switch corresponding to close and open positions corresponding to the contactor cycling.

Predicting contactors nearing end of life or in the process of approaching totally stuck closed, where a contactor with main power contacts initially closed cycles between executing a controller's open command (i.e., being open) and not executing the open command (i.e., being closed) either in a regular or irregular/random manner. Correspondingly, the auxiliary switch contacts cycle between closed and open positions. An input voltage applied to one leg or contacts of the auxiliary switch to ground results in detected output voltage that cycles between zero (0) and voltage same as input voltage as long as the auxiliary switch cycles between open and closed positions corresponding to the contactor main contacts cycling.

Identifying a contactor's normal operation, where a contactor with main power contacts initially open executes a controller's close command while the contactors auxiliary contacts open. An input voltage applied to one leg or contact of the auxiliary switch to ground results in detected output voltage of 0 as long as the auxiliary switch is open while detecting a temperature rise over time for an energized contactor on a heating device or device that produces heat. No intervention or action is required since contactor is operating as expected.

Identifying a contactor's normal operation, where a contactor with main power contacts initially closed executes a controller's open command while the contactor's auxiliary contacts close. An input voltage applied to one leg or contact of the auxiliary switch to ground results in a detected output voltage that is about same as the input voltage as long as the auxiliary switch is closed while also detected a temperature drop over time for a de-energized contactor on a heating device or device that produces heat. No intervention or action is required since contactor is operating as expected.

Identifying a contactor's abnormal operation, where a contactor with main power contacts initially opened fails to execute a controller's close command while the contactors auxiliary contacts remain closed. An input voltage applied to one leg or contact of the auxiliary switch to ground results in a detected output voltage that is about same as the input voltage as long as the auxiliary switch is closed while also detecting a temperature drop over time for a de-energized contactor on a heating device or device that produces heat. In such case, a device connected to the contactor is not energized as desired, and the controller generates an error message to prompt for service required intervention.

Identifying a contactor's abnormal operation, where a contactor with main power contacts initially closed fails to execute a controller's open command while the contactors auxiliary contacts remain open. An input voltage applied to one leg or contact of the auxiliary switch to ground results in a detected output voltage of about zero (0) as long as the auxiliary switch is open while also detecting a temperature rise above a setpoint or critical temperature over time for an energized contactor on a heating device or device that produces heat. A device connected to the contactor continues to be energized when undesired, which prompts for machine self-intervention including: controller issuing an error message, ensuring water levels in the wash tank and booster are at acceptable levels (if low, machine turns on the fill to maintain level, machine deactivates and locks out the drain pump), and concurrently prompting for service required intervention.

Various advantages of the system are, as follows: concept provides extra protection for some electrical circuits and machines; concept applicable to equipment using contactors to control components such as pumps, heaters, fans and compressors; could be used for predictive maintenance; prevents run away system operation; and prevents or reduces downtime (e.g., if a unit broke down unexpectedly).

It is to be clearly understood that the above description is intended by way of illustration and example only, is not intended to be taken by way of limitation, and that other changes and modifications are possible. The auxiliary contact detected voltages could be stored in controller memory for later evaluation as needed, as could the thermocouple temperatures. While the above description focuses on use of the contactor in connection with a heating element of a warewash machine wash tank, variations are possible. For example, the contactor could be connected to control power to a pump or fan of the machine. The warewash machine could be configured as a conveyor-type machine having multiple treatment zones through which wares are moved during the cleaning process. The contactor monitoring system could be implemented in other food equipment devices, such as cooking devices (e.g., steam oven, combination oven, convection oven, electrical cooktop, griddle, etc.). Although the above description focuses on monitoring the voltage at a set of auxiliary contacts that operate opposite to the main power contacts, systems in which the auxiliary contacts operate the same as the main power contacts (i.e., auxiliary contacts open when main power contacts open, and auxiliary contacts close when main power contacts close) are also possible. In a system in which the auxiliary contacts operate the same as the main power contacts, the expected voltage detected at the auxiliary contacts (high or low) in a given circumstance would be the opposite of that described above for the contactor in which the auxiliary contacts operate opposite to the main power contacts. The primary embodiment described above focuses on a system in which a voltage detector is used to detect the open or closed state of the auxiliary contacts, but other electrical sensors could be used. For example, a current sensor 180 (shown in dashed line form in FIG. 5A) could be used detect a current flow condition (e.g., current flow occurring, no current flow occurring and/or level of current flow occurring) between the auxiliary contacts in order to determine the open or closed state of the auxiliary contacts. Such a current sensor could be associated with either auxiliary contact. Still other variations are possible.

What is claimed is:

1. A warewash machine, comprising:
   a housing at least in part defining a treatment chamber having an access opening;
   at least one nozzle for emitting liquid into the treatment chamber;
   a tank including a heating element for heating liquid in the tank, and a line running from the tank to the at least one nozzle;
   a power line path for delivering power to the heating element;
   a contactor for controlling power delivery to the heating element, the contactor including main power contacts connected in the power line path and auxiliary contacts that operate the same as, or opposite to, the main power contacts; and
   a monitoring system operatively connected to the auxiliary contacts to monitor an open or closed state of the auxiliary contacts, wherein the monitoring system is configured to identify abnormal contactor operation based upon the open or closed state of the auxiliary contacts.

2. The warewash machine of claim 1, wherein the auxiliary contacts include a first auxiliary contact and a second auxiliary contact, wherein the monitoring system includes an electrical sensor for detecting one of (i) a voltage condition of the second auxiliary contact or (ii) a current flow condition between the first auxiliary contact to the second auxiliary contact.

3. The warewash machine of claim 2, wherein the monitoring system includes a controller operatively connected to (i) a control input of the contactor for commanding an open state or a closed state of the main power contacts and (ii) the electrical sensor for monitoring the voltage condition or the current flow condition, wherein the controller is configured to identify abnormal contactor operation based upon at least both of (a) a command state of the main power contacts and (b) the voltage condition or the current flow condition.

4. The warewash machine of claim 1, wherein the auxiliary contacts include a first auxiliary contact and a second auxiliary contact, wherein the monitoring system includes a voltage source operatively connected to the first auxiliary contact and at least one of (i) a voltage detector operatively connected to the second auxiliary contact or (ii) a current detector associated with one of the first auxiliary contact or the second auxiliary contact.

5. The warewash machine of claim 4, wherein the monitoring system further comprises a temperature sensor.

6. The warewash machine of claim 4, wherein the monitoring system includes the voltage detector and a controller operatively connected to (i) a control input of the contactor for commanding an open or closed state of the main power contacts and (ii) the voltage detector for monitoring a voltage level of the second auxiliary contact.

7. The warewash machine of claim 6, wherein the auxiliary contacts operate opposite to the main power contacts, wherein the controller is configured to identify an abnormal contactor operation based at least in part upon:
   (i) a condition in which the controller is commanding the main power contacts to be closed and the voltage level of the second auxiliary contact is above a first threshold;
   or (ii) a condition in which the controller is commanding the main power contacts to be open and the voltage level of the second auxiliary contact is below a second threshold.

8. The warewash machine of claim 6, wherein the auxiliary contacts operate the same as the main power contacts, wherein the controller is configured to identify an abnormal contactor operation based at least in part upon:
   (i) a condition in which the controller is commanding the main power contacts to be closed and the voltage level of the second auxiliary contact is below a first threshold;
   or
   (ii) a condition in which the controller is commanding the main power contacts to be open and the voltage level of the second auxiliary contact is above a second threshold.

9. The warewash machine of claim 6, wherein:
(A) the auxiliary contacts operate opposite to the main power contacts, wherein the controller is configured to:
   (i) identify a first abnormal contactor operation state based at least in part upon a condition in which the controller is commanding the main power contacts to be closed and the voltage level of the second auxiliary contact is above a first threshold; and
   (ii) identify a second abnormal contactor operation state based at least in part upon a condition in which the controller is commanding the main power contacts to be open and the voltage level of the second auxiliary contact is below a second threshold;
or
(B) the auxiliary contacts operate the same as the main power contacts, wherein the controller is configured to:
   (i) identify a first abnormal contactor operation state based at least in part upon a condition in which the controller is commanding the main power contacts to be closed and the voltage level of the second auxiliary contact is below a first threshold; and
   (ii) identify a second abnormal contactor operation state based at least in part upon a condition in which the controller is commanding the main power contacts to be open and the voltage level of the second auxiliary contact is above a second threshold.

10. The warewash machine of claim 9, wherein:
the controller is configured such that, upon identification of the first abnormal contactor operation state, the controller initiates an error message; and
the controller is configured such that, upon identification of the second abnormal contactor operation state, the controller initiates a shutdown mode of the warewash machine.

11. The warewash machine of claim 10, wherein, in the shutdown mode of the warewash machine, a drain pump of the tank is deactivated, washing operations of the warewash machine are prevented, a liquid level in the tank is maintained above a threshold level, and an error message is initiated.

12. The warewash machine of claim 9, wherein the controller is configured such that, upon identification of the second abnormal contactor operation state, the controller energizes the contactor one or more times in attempt to clear the second abnormal contactor operation state.

13. A method of operating a warewash machine that includes a housing at least in part defining a treatment chamber having an access opening, at least one nozzle for emitting liquid into the treatment chamber, a tank including a heating element for heating liquid in the tank, a line running from the tank to the at least one nozzle, a power line path for delivering power to the heating element, and a contactor for controlling power delivery to the heating element, the contactor including main power contacts connected in the power line path and auxiliary contacts that operate the same as, or opposite to, the main power contacts, the method comprising the steps of:
   applying a voltage to the first auxiliary contact;
   detecting at least one of (i) a voltage condition at the second auxiliary contact or a current flow condition between the first auxiliary contact and the second auxiliary contact; and
   identifying abnormal contactor operation based upon at least (i) the voltage condition or the current condition and (ii) a command state of the main power contacts.

14. The method of claim 13, wherein the first and second auxiliary contacts are configured to operate the same as the main power contacts, and the step of identifying involves:
   (i) the command state of the main power contacts being closed and the voltage condition of the second auxiliary contact being above a first threshold;
   or
   (ii) the command state of the main power contacts being open and the voltage condition of the second auxiliary contact being below a second threshold.

15. The method of claim 13, wherein the first and second auxiliary contacts are configured to operate opposite to the main power contacts, and the step of identifying involves:
   (i) the command state of the main power contacts being closed and the voltage condition of the second auxiliary contact being below a first threshold;
   or
   (ii) the command state of the main power contacts being open and the voltage condition of the second auxiliary contact being above a second threshold.

16. The method of claim 13, further comprising:
   upon identification of abnormal contactor operation, initiating an electronic error message and/or initiating a shutdown mode of the warewash machine.

* * * * *